United States Patent
Varis

(10) Patent No.: US 6,997,755 B2
(45) Date of Patent: Feb. 14, 2006

(54) CONNECTOR AND CONTACT WAFER

(75) Inventor: Arvo Varis, Joensuu (FI)

(73) Assignee: Perlos Oyj, Vantaa (FI)

( * ) Notice: Subject to any disclaimer, the term of this patent is extended or adjusted under 35 U.S.C. 154(b) by 0 days.

(21) Appl. No.: 10/610,649

(22) Filed: Jul. 2, 2003

(65) Prior Publication Data

US 2004/0067690 A1   Apr. 8, 2004

Related U.S. Application Data

(63) Continuation of application No. PCT/FI02/00102, filed on Feb. 11, 2002.

(30) Foreign Application Priority Data

Feb. 12, 2001   (FI) .................................. 20010263

(51) Int. Cl.
*H01R 13/502*   (2006.01)
(52) U.S. Cl. ...................... 439/701; 439/485; 439/608; 439/108

(58) Field of Classification Search ................ 439/701, 439/607–608, 108, 485, 196, 206
See application file for complete search history.

(56) References Cited

U.S. PATENT DOCUMENTS

| | | | |
|---|---|---|---|
| 5,934,944 A * | 8/1999 | Aoyama et al. ............ 439/701 |
| 5,997,362 A * | 12/1999 | Hatagishi et al. ........... 439/701 |
| 6,146,202 A * | 11/2000 | Ramey et al. .............. 439/608 |
| 6,386,924 B1 * | 5/2002 | Long ........................... 439/701 |
| 6,431,914 B1 * | 8/2002 | Billman ...................... 439/608 |
| 6,514,103 B1 * | 2/2003 | Pape et al. .................. 439/608 |
| 6,551,140 B1 * | 4/2003 | Billman et al. ............. 439/608 |

* cited by examiner

*Primary Examiner*—Truc Nguyen
(74) *Attorney, Agent, or Firm*—Young & Thompson

(57) ABSTRACT

A connector and a contact wafer. The connector (1) comprises contacts one on top of another and in parallel and the wafer body (8) comprises at least one channel (9) which is arranged between contacts (4) arranged in parallel and extends to the lower surface of the wafer body (8).

16 Claims, 2 Drawing Sheets

CONNECTOR AND CONTACT WAFER

CROSS REFERENCE TO RELATED APPLICATIONS

This application is a Continuation of International Application PCT/FI02/00102 filed Feb. 11, 2002, which designated the U.S. and was published under PCT Article 21(2) in English.

FIELD OF THE INVENTION

The invention relates to a connector which comprises a connector body, contacts, which are arranged both one on top of another and parallel with one another partly inside the body, at least one wafer to which the contacts arranged one on top of another are attached and which comprises a wafer body.

The invention further relates to a contact wafer which comprises a wafer body, at least two contacts which are arranged one on top of another, the wafer being arrangeable parallel with at least one other wafer in the connector body.

BACKGROUND OF THE INVENTION

The connectors concerned are used particularly for transmitting signals and electric current between circuit boards or generally in applications which require fast data transmission and/or high signal frequency.

Connectors are attached to a circuit board by the 'Pin-in Paste' method where paste is spread onto the circuit board and then the connector is positioned on the circuit board. The circuit board and its connectors and other components are put in a convection oven or in a similar heated and closed section of the assembly line. The circuit boards and the components thereon are heated by actively circulating hot air around the components and the circuit board. Thermal energy solders the contact pins of the connector to the circuit board.

It is known to assemble a connector from wafers which are typically produced by injection-moulding a plastic body around the contact pins of contacts arranged in one row one on top of another. A necessary number of contact pieces are assembled next to one another in the connector at hand, after which the contacts are placed inside the connector body. Wafers facilitate handling of small contacts, keep contacts pins at a correct distance from one another and also support one another.

Soldering of connectors and contact pieces of the prior art to a circuit board involves the following problems: the bodies of wafers attached next to one another limit access of hot air to the lowest contact pins of the wafer. In that case the temperature of the lowest contact pins and the surfaces to be soldered to the pins is lower than that of the other surfaces to be soldered and thus their soldering is unreliable. This is naturally a problem in respect of the reliability of the connector. On the other hand, quick attachment of a connector at as low a temperature as possible is desirable so that the heat does not damage the other components of the circuit board.

SUMMARY OF THE INVENTION

The object of the present invention is to provide a connector and a contact wafer to avoid the above-mentioned drawbacks.

The connector of the invention is characterized in that the wafer body comprises at least one channel, which is arranged between the contacts arranged in parallel and extends to the lower surface of the wafer body.

The contact wafer of the invention is characterized in that the wafer is provided with at least one channel which extends to its lower surface.

The basic idea of the invention is that the contact wafers are shaped so that a channel through which air can flow to the contact pins is formed between the contacts of adjacent contact wafers. Furthermore, the idea of a preferred embodiment of the invention is that the channel is arranged between two contact wafers. In addition, the idea of another preferred embodiment of the invention is that the channel extends from the upper surface of the contact pieces to the lower surface of the wafer.

An advantage of the invention is that when contact pins are soldered to the circuit board, hot air flows through the channel to the lowest contact pins and thus the temperature of these contact pins rises faster, which considerably improves their solderability to the circuit board compared to the prior art. Soldering of a connector to the circuit board becomes faster while the thermal stress on other components decreases. All in all, the costs of the soldering process decrease. Furthermore, less material is needed for the wafer body, which reduces the material costs.

BRIEF DESCRIPTION OF THE DRAWING

The invention will be described in greater detail in the accompanying drawings, in which.

DETAILED DESCRIPTION OF THE INVENTION

Figure 1:
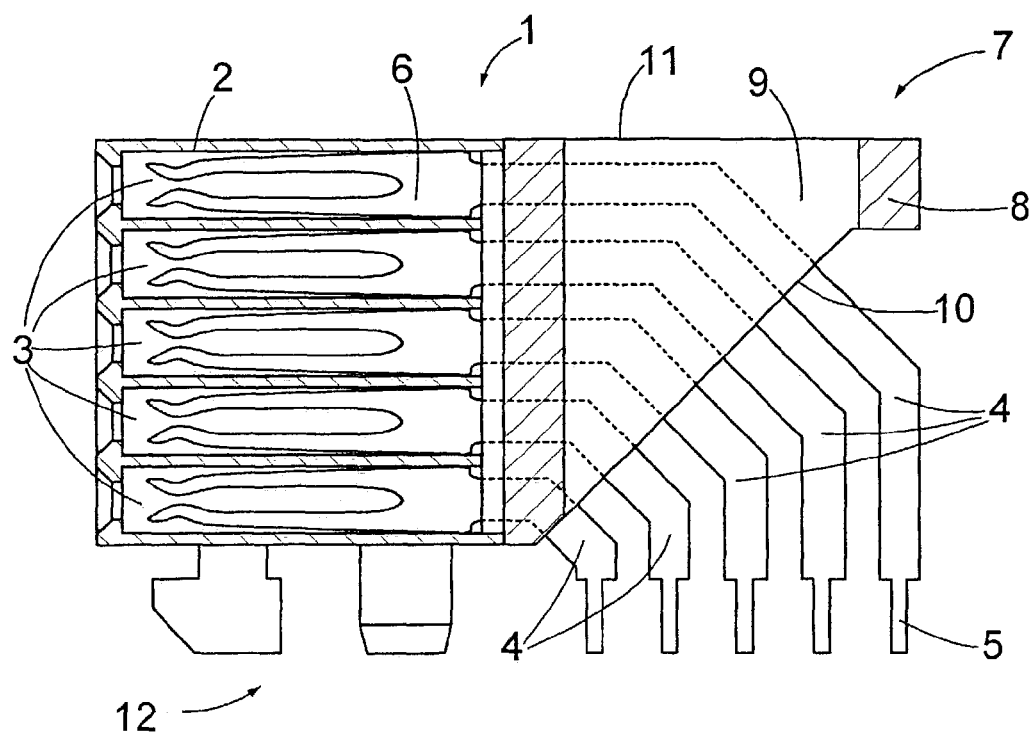
FIG. 1 is a partially cross-sectional and schematic side view of an embodiment of the connector and contact wafer according to the invention.
Figure 2:
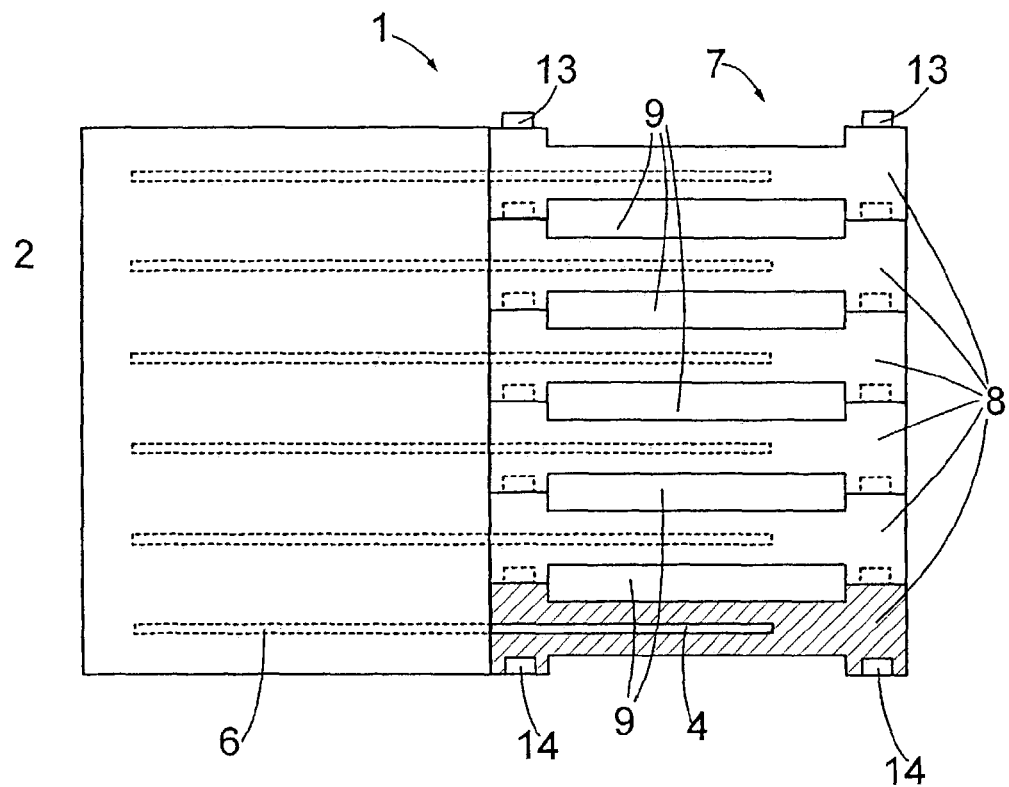
FIG. 2 is a partially cross-sectional and schematic top view of an embodiment of the connector and contact wafer according to FIG. 1.

FIG. 1 is a partially cross-sectional and schematic side view of an embodiment of the connector and contact wafer according to the invention. It should be pointed out here that even though the connector 1 shown in FIGS. 1 and 2 is a female connector, the invention is also applicable to male connectors.

A connector body 2 comprises contact spaces 3, inside of which the contact arms 6 of contacts 4 are arranged. The connector body 2 is most often made of plastic by injection-moulding or pressing, for example. The contacts 4 are arranged one on top of another and in parallel in the connector body 2. Each of the contacts 4 arranged one on top of another is attached to the same wafer 7 in a manner known per se: in the embodiment shown in FIG. 1 there are five contacts 4 one on top of another, which means that each wafer 7 includes five contacts 4. The wafers 7 comprise a substantially triangular wafer body 8, which is typically produced by injection-moulding it around contacts 4 arranged in one row. Naturally the wafer body 8 can be shaped otherwise. At one end of the contact 4 there is a contact pin 5, which is soldered to the circuit board or to another similar base to be connected to the connector 1. In most cases the connector body 2 is also soldered to the circuit board by means of a separate soldering board. The contact 4 is made of a suitable conductive material, usually from a metal or a metal alloy. The wafers 7 are most often attached to the connector body 2 by providing the contact arms 6 with claw-like protrusions, which cling to the body 2 made of plastic. The contacts of the other member of the connector pair, which in this case is a male connector, are connected to contact arms 6, and consequently electric signals and/or supply current can be transmitted via the connector pair.

Between the wafers there is a channel 9 which extends to the lower surface 10 of the wafer 7, i.e. to the side of the wafer body 8 where the contact pins 5 of the contacts 4 are. The other end of the channel 9 extends to the upper surface 11 of the wafer, i.e. to the side of the wafer body 8 that is opposite to the contact pins 5. It should be noted that in this application the term 'channel' refers both to a channel whose cross section is closed and to a channel whose cross section is at least partly open.

As stated above, the contact pins 5 of the connector 1 are soldered to the circuit board and the thermal energy needed in soldering is supplied to the surfaces to be soldered by circulating hot air to them. Hot air can flow substantially freely through the air channels 9 to the contact pins 5 and their counter surfaces. Thanks to this substantially free airflow, the temperature distribution is very even at the contact pins 5, and thus the properties of all soldered joints between the contact pins 5 and the circuit board are substantially similar. In other words, the earlier problems caused by poor soldering of the contact pins 5 of the lowest contacts are avoided.

It should be noted that the shape and dimensions of the contacts and other details shown in the figures are only exemplary. The connector body 2 also comprises other functional parts 12 which are known per se to a person skilled in the art and related e.g. to mechanical coding of the connector 1, positioning of the connector 1 on the circuit board, etc.

FIG. 2 is a partially cross-sectional and schematic top view of an embodiment of the connector and contact wafer according to FIG. 1. The connector 1 comprises six wafers 7 altogether, which are arranged in parallel and each of which comprises five contacts 4 arranged one on top of another: the connector 1 shown in FIGS. 1 and 2 contains 30 contacts 4 altogether. It should be noted here that each wafer 7 does not necessarily have to include an equal number of contacts 4 but their number may vary depending on the application. In the embodiment shown in the figure the wafers 7 are connected to one another with interference fits where a protrusion 13 provided in the wafer body 8 is pressed into a cavity 14 provided in the body 8 of the adjacent wafer. However, the wafers 7 can also be attached to one another by another method known per se. The wafers 7 facilitate handling of contacts 4, which are often very small.

The channels 9 are arranged between contacts 4 belonging to different wafers 7 so that the cross section of the channel 9 is defined by the shape of the body 8 of two wafers. A cavity is provided on both sides of the body 8 of the wafers and the channel 9 is formed from the cavities of adjacent wafers arranged against each other. The channels 9 are preferably as spacious as possible because in that case the thickness of the boundary layer of turbulent airflow in the channel 9 restricts airflow through the channel 9 as little as possible.

Figure 3:
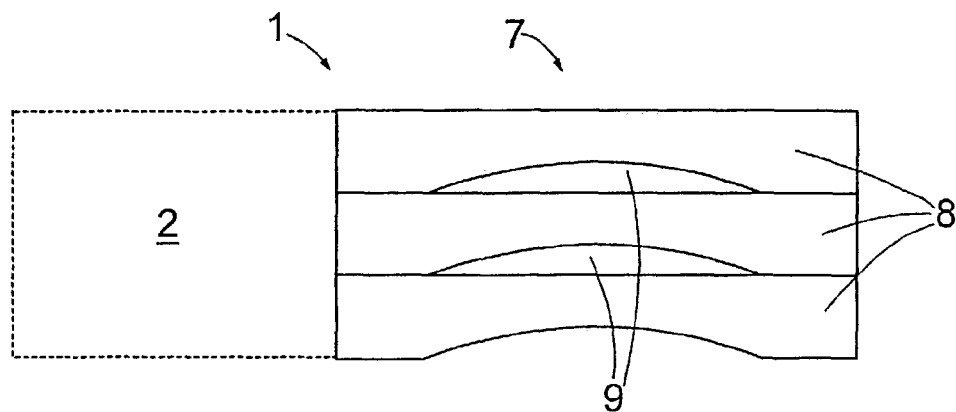
FIG. 3 is a schematic top view of a second embodiment of the contact wafer according to the invention.

FIG. 3 is a schematic top view of a second embodiment of the contact wafer attached to the connector body 2. To simplify the illustration, the connector body 2 is shown by a broken line in FIG. 3. The connector 1 comprises three wafers 7 arranged in parallel in the connector body 2. One side of the wafer body 8 is provided with a groove and each channel 9 is formed from the space defined by this groove and the body 8 of the other wafer arranged on the side of the groove. The channel 9 extends from the upper surface of the wafer body 8 to the lower surface and functions in the same way as described in connection with FIGS. 1 and 2.

Figure 4:
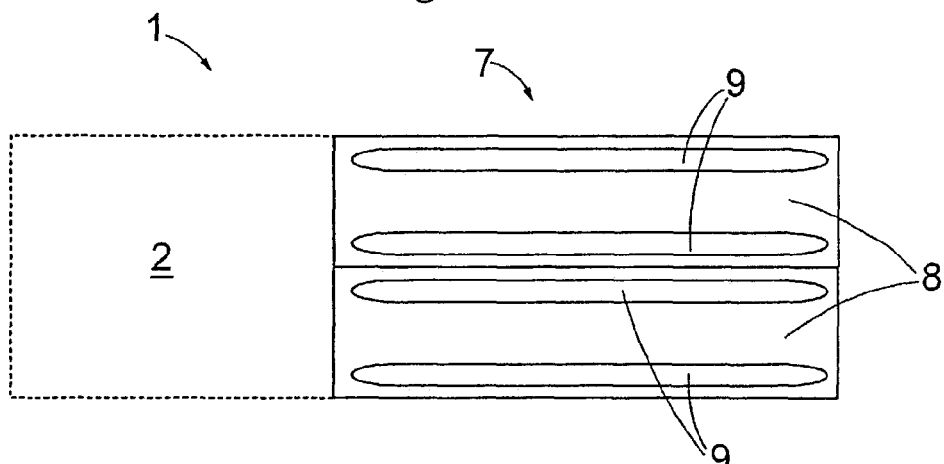
FIG. 4 is a schematic top view of a third embodiment of the contact wafer according to the invention.

FIG. 4 is a schematic top view of a third embodiment of the contact wafer attached to the connector body 2. To simplify the illustration, the connector body 2 is shown by a broken line in FIG. 4. The connector 1 comprises two wafers 7 which are arranged in parallel in the connector body 2. Now a single channel 9 is not formed between the body 8 of two wafers but the whole channel is arranged inside the body 8 of one and the same wafer, in other words, the shape of the body 8 of one wafer defines the shape of the channel 9. In the embodiment shown in FIG. 4 the body 8 of each wafer includes two channels 9 but the number of channels may naturally vary. The channels 9 extend through the body 8 of the wafer up to its lower surface.

Figure 5:
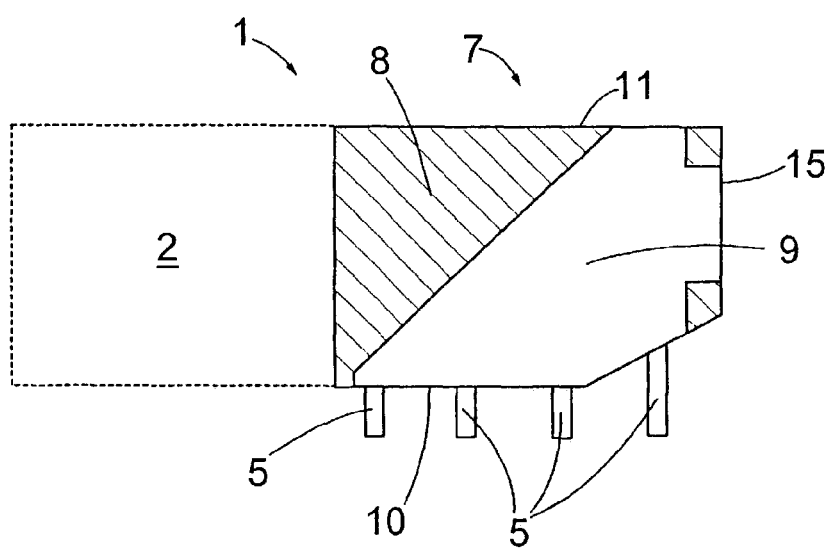
FIG. 5 is a cross-sectional and schematic side view of a fourth embodiment of the contact wafer according to the invention.

FIG. 5 is a cross-sectional schematic side view of a fourth embodiment of the contact wafer attached to the connector body 2. To simplify the illustration, the connector body 2 is shown by a broken line. One end of the channel 9 extends to the lower surface of the wafer body 8 and the other end partly to the upper surface and partly to the rear side, i.e. to the side away from the connector body 2. The channel 9 can also be shaped in various other ways, provided that it extends to the lower surface of the wafer body 8 and increases air circulation near the contact pins 5.

The drawings and the related description are only intended to illustrate the inventive concept. The details of the invention may vary within the scope of the claims. Thus the number of contacts in the wafer 7 and the number of wafers 7 in the connector 1 may differ from those shown in the figures. There does not need to be a channel 9 in each contact wafer 7 or between each two wafers 7. In the embodiment shown in FIG. 4 the two channels 9 in the same wafer 7 can combine into one channel 9 at some point of the wafer. One or more channels 9 can be arranged between contacts 4 belonging to different wafers 7; furthermore, the number of air channels 9 and the shape and area of the cross-sectional surface can differ in different sections of the channel 9. Contacts 4 can be arranged in the same wafer 7 both one on top of another and in parallel.

What is claimed is:

1. A connector which comprises:
   a connector body,
   contacts, which are arranged both one on top of another and parallel with one another partly inside the connector body,
   at least one wafer to which the contacts arranged one on top of another are attached and which comprises a wafer body,
   wherein the wafer body comprises at least one channel which is arranged between the contacts arranged in parallel and extends to the lower surface of the wafer body, and wherein the channel extends from the lower surface of the wafer body to the upper surface of the wafer body so as to allow air flow through said at least one channel toward said contacts.

2. A connector according to claim 1, wherein the cross section of the channel is substantially closed and the channel is formed between the wafers so that the shape of the body of two wafers defines the cross section of the channel.

3. A connector according to claim 1, where in the cross section of each channel is substantially closed and each channel is formed in such a manner that it is limited inside the wafer body.

4. A connector according to claim 1, wherein in that the connector is a female connector.

5. A connector according to claim 1, wherein the connector is a male connector.

6. A connector according to claim 1, wherein the connector is a signal connector.

7. A connector according to claim 1, wherein the connector is a current supply connector.

8. A connector according to claim 1, wherein the connector is connected to a circuit board by soldering.

9. A contact wafer which comprises:
a wafer body,
at least two contacts, which are arranged one on top of another, each of said at least two contacts comprising a respective contact pin, which is solderable to a base that is connectable to the wafer,
the wafer being arrangeable parallel with at least one other wafer in a connector body, wherein the wafer is provided with at least one channel which extends to its lower surface, and
wherein the channel extends from a lower surface of the wafer body to an upper surface of the wafer body.

10. A contact wafer according to claim 9, wherein at least one groove is provided at least on one side of the wafer body, the groove forming said channel between the contact pieces arranged parallel with each other.

11. A wafer according to claim 9, wherein the cross section of the channel is substantially closed and the channel is formed in such a manner that it is limited inside the wafer body.

12. The contact wafer according to claim 9, wherein said at least one channel is structured and arranged so as to allow air flow through said at least one channel to said at least two contacts.

13. A contact wafer according to claim 10, wherein the groove is formed on both sides of the wafer body.

14. A connector comprising:
a connector body;
a plurality of contacts extending partly inside said connector body; and
a wafer connected to said plural contacts and comprising a wafer body,
said wafer body comprising at least one channel that extends therethrough, so as to allow air flow through said at least one channel to said plural contacts,
wherein the plural contacts are arranged one on top of another such that air flows from a top one of said plural contacts to a lower one of said plural contacts through said at least one channel.

15. The connector according to claim 14, further comprising a plurality of wafers, said at least one channel being formed between an adjacent two bodies of said plural wafers.

16. The connector according to claim 15, wherein the plural contacts are arranged both one on top of another and parallel to one another.

* * * * *